(12) United States Patent
Matz et al.

(10) Patent No.: US 7,732,345 B2
(45) Date of Patent: Jun. 8, 2010

(54) METHOD FOR USING A MODIFIED POST-ETCH CLEAN RINSING AGENT

(75) Inventors: Phillip Daniel Matz, Murphy, TX (US); Trace Hurd, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 212 days.

(21) Appl. No.: 11/468,884

(22) Filed: Aug. 31, 2006

(65) Prior Publication Data
US 2008/0057730 A1  Mar. 6, 2008

(51) Int. Cl.
*H01L 21/302* (2006.01)
(52) U.S. Cl. .............. 438/745; 438/627; 438/684; 438/789; 438/790; 216/27; 216/37; 216/67; 134/2; 134/6; 134/1.3
(58) Field of Classification Search ........... 438/745; 216/67; 134/2
See application file for complete search history.

(56) References Cited

U.S. PATENT DOCUMENTS

| | | | |
|---|---|---|---|
| 5,855,792 A * | 1/1999 | Adams et al. | 210/696 |
| 6,517,637 B1 * | 2/2003 | Fu et al. | 134/6 |
| 6,613,681 B1 * | 9/2003 | Hillyer et al. | 438/704 |

* cited by examiner

*Primary Examiner*—Nadine Norton
*Assistant Examiner*—Maki Angadi
(74) *Attorney, Agent, or Firm*—Warren L. Franz; Wade J. Brady, III; Frederick J. Telecky, Jr.

(57) ABSTRACT

The present invention provides a method for manufacturing an integrated circuit. In one embodiment, the method includes etching one or more openings within a substrate using an etch tool, and subjecting the one or more openings to a post-etch clean, wherein a delay time exists between removing the substrate from the etch tool and the subjecting the one or more opening to the post-etch clean. This method may further include exposing the substrate having been subjected to the post-etch clean to a rinsing agent, wherein a resistivity of the rinsing agent is selected based upon the delay time.

14 Claims, 1 Drawing Sheet

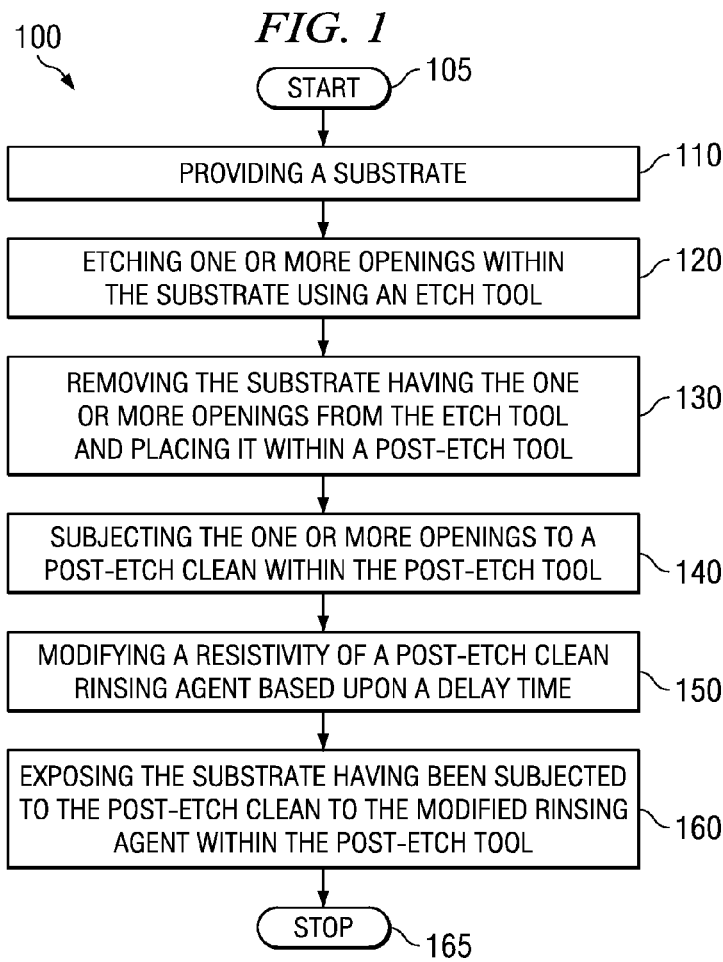
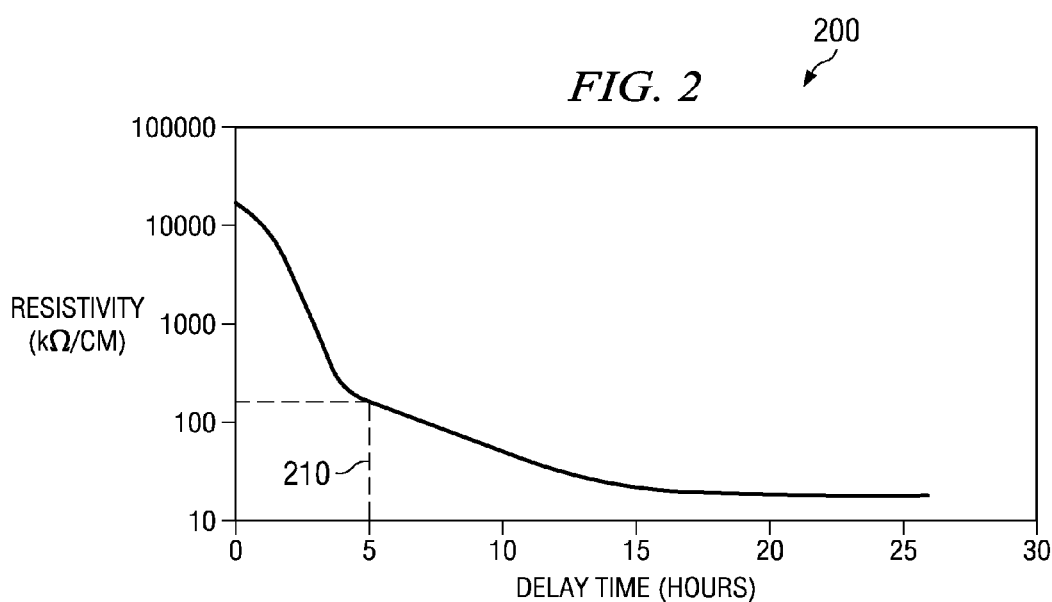

METHOD FOR USING A MODIFIED POST-ETCH CLEAN RINSING AGENT

TECHNICAL FIELD OF THE INVENTION

The present invention is directed, in general, to the manufacture of integrated circuits and, more specifically, to a method for using a modified post-etch clean rinsing agent in the manufacture of integrated circuits.

BACKGROUND OF THE INVENTION

Recent advances in the area of integrated circuit metallization technology have been important in decreasing the necessary chip area for modern integrated circuits. One such advance is the increased number of metal levels that are manufacturable in a device, providing both dramatic reduction in necessary chip area and corresponding dramatic increases in device density. Recent technological advances have also provided significant reductions in the line pitch of conductors in these multiple metal levels, also greatly increasing the functional density of the chip.

As the density of the conductors increases, conventional etches and post-etch cleans used to define the vias or trenches (e.g., the vias or trenches that will ultimately form the conductors) tend to be unacceptable. For example, aggressive post-etch solvent cleans designed to remove unwanted residue from the sidewalls and bottom surface of the vias or trenches prior to the deposition of the conductors, tend to induce unacceptable changes in the desired value for the size of the vias or trenches, or so called critical dimensions (CD's) of the vias or trenches. On the other hand, less aggressive post-etch solvent cleans leave the CD's of the vias or trenches substantially unchanged, however, they also leave undesirable residue which tends to lead to yield loss.

Accordingly, what is needed in the art is a new process for defining openings in a substrate, particularly vias and trenches within dielectric layers, that does not experience the problems of the prior art.

SUMMARY OF THE INVENTION

To address the above-discussed deficiencies of the prior art, the present invention provides a method for manufacturing an integrated circuit. In one embodiment, the method includes etching one or more openings within a substrate using an etch tool, and subjecting the one or more openings to a post-etch clean, wherein a delay time exists between removing the substrate from the etch tool and subjecting the one or more openings to the post-etch clean. This method may further include exposing the substrate having been subjected to the post-etch clean to a rinsing agent, wherein a resistivity of the rinsing agent is selected based upon the delay time.

In an alternative embodiment, the method includes subjecting one or more openings in a substrate to a post-etch clean to remove undesirable residue from the one or more openings, and exposing the substrate having been subjected to the post-etch clean to a rinsing agent, the rinsing agent having a resistivity ranging from about 120 kΩ/cm to about 13,000 kΩ/cm.

In an even different embodiment, the method includes subjecting one or more openings in a substrate to a post-etch clean to remove undesirable residue from the one or more openings, and exposing the substrate having been subjected to the post-etch clean to a rinsing agent having a resistivity, the rinsing agent being supplied from a tool including an interface for readily adjusting the resistivity of the rinsing agent.

BRIEF DESCRIPTION OF THE DRAWINGS

For a more complete understanding of the present invention, reference is now made to the following descriptions taken in conjunction with the accompanying drawings, in which:

FIG. 1 illustrates a flow diagram illustrating how one skilled in the art might manufacture an integrated circuit in accordance with the principles of the present invention; and FIG. 2 illustrates a graph depicting the relationship, at least in one embodiment, between the delay time and the desired resistivity of the post-etch clean rinsing agent.

DETAILED DESCRIPTION

The present invention is based, at least in part, on the acknowledgement that there is a trade-off between an aggressive post-etch clean of openings within a substrate, and the undercleaned openings that result from a less aggressive post-etch clean. For example, the present invention has acknowledged that the aggressive post-etch clean ultimately results in a change in a desired dimension in the opening (e.g., critical dimension (CD) change), whereas the less aggressive post-etch clean tends to result in yield loss. The present invention has further acknowledged that few, if any, post-etch cleans exist that leave the desired CD substantially unchanged, but adequately clean the substrate.

Based upon these acknowledgements, and substantial experimentation, the present invention innovatively recognizes that a modified post-etch clean rinsing agent may be used to remove at least a portion, if not a substantial portion, of any residue remaining after the post-etch clean. For example, the present invention innovatively recognizes that a post-etch clean rinsing agent having a specifically tailored resistivity may be used to remove any remaining residue that may exist after the post-etch clean. Resistivity, as used in this context, means the resistance of the rinsing agent to the conduction of an electrical current.

In one example, the present invention recognizes that a rinsing agent having a resistivity selected based upon the delay time between removing the substrate from an etch tool and subjecting the substrate to the post-etch clean may be used to remove remaining residue that may exist after the post-etch clean. Without being limited to such, it is postured that the rinsing agent having the modified resistivity may react with certain elements of the remaining post-etch clean to cause the rinsing agent to have a reactive component. It is further postured that it is this reactive component that removes at least a portion of any remaining residue. Thus, the rinsing agent, in addition to diluting and washing away the post-etch clean, further removes at least a portion of any remaining residue.

Turning now to FIG. 1, illustrated is a flow diagram 100 illustrating how one skilled in the art might manufacture an integrated circuit in accordance with the principles of the present invention. The flow diagram 100 of FIG. 1 begins in a start step 105. Thereafter, in a step 110, a substrate is provided. The substrate provided in step 110 may be many different substrates that might be used within an integrated circuit. Nevertheless, in the given embodiment disclosed in FIG. 1 the substrate is a dielectric layer, and more specifically a low-K dielectric layer, as might be used as an interlevel dielectric layer or intermetal dielectric layer in the integrated circuit. Those skilled in the art appreciate the steps required to obtain and provide such a substrate.

Thereafter, in a step 120, one or more openings may be etched within the substrate provided in the previous step 110.

The one or more openings, at least in the embodiment discussed with respect to FIG. 1, are one or more vias or trenches etched within the substrate. Again, the substrate in this embodiment is a dielectric layer, thus the one or more vias or trenches are etched within the dielectric layer.

Those skilled in the art understand the process for forming such openings, including placing the substrate within an etch tool and etching the vias or trenches using an etchant and photoresist or a hardmask. In certain instances, the one or more openings are dual damascene openings, and thus each individual dual damascene opening includes a via portion and a trench portion. In the manufacture of such dual damascene openings, multiple patterning and etch steps may be required.

The etch used to form the one or more openings often tends to leave undesirable residue at the completion of the etch. For example, in those instances wherein a plasma etch tool is used to form the one or more openings, polymer residue from the plasma etch process often tends to form along the sidewalls and bottom surface of the one or more openings. In those instances wherein a non-plasma etch tool is used, other undesirable residue may also result.

After step 120, in a step 130, the substrate having the one or more openings therein may be removed from the etch tool and placed within a post-etch tool. The post-etch tool, in the given embodiment, is a post-etch clean tool as might be used to remove undesirable residue located on the substrate or within the one or more openings. As will be further discussed below, the post-etch clean tool may have certain innovative features, many of which are not embodied in the prior art post-etch clean tools.

Thereafter, in a step 140, the substrate having the openings therein may be subjected to a post-etch clean within the post-etch tool. In most instances, the post-etch clean uses a solvent to remove, or at least attempt to remove, the undesirable residue located on the substrate or within the one or openings. The particular solvent chosen, in one embodiment, should be based upon a desire to remove as much of the residue without substantially changing a CD of the one or more openings. For instance, in one embodiment the idea is to change a desired dimension of the one or more openings (e.g., critical dimension of the one or more openings) by about 2% or less. Such a limited percent change in the CD may be, and most likely is, important to the process disclosed herein.

The post-etch clean solvent, in many of the desired applications, is a fluoride-containing semi-aqueous solvent. For instance, in one embodiment, the solvent is EKC-6910, as might be purchased from Dupont, having a principal place of business at 1007 Market Street, Wilmington, Del., 19898. The EKC-6910 solvent appears to provide an adequate amount of residue removal, while limiting the change of the CD of the one or more openings. Other solvents providing similar results to the EKC-6910 solvent undoubtedly also exist.

Thereafter, in a step 150, a resistivity of a post-etch clean rinsing agent may be modified based upon a delay time. For example, in one embodiment the resistivity is modified based upon a delay time between the removing the substrate from the etch-tool and the beginning of the post-etch clean. Thus, in this embodiment the modifying is somewhat real-time. In another embodiment, the delay time is the delay time between removing a different substrate in a different lot from the etch-tool and the beginning of a post-etch clean on that different substrate. In such an embodiment, the delay time of one lot of wafers is applied to modify a resistivity of a post-etch clean rinsing agent that will ultimately be applied to a substrate in a different lot of wafers. Such an embodiment would generally only be feasible when the delay times for the various lots of wafers are believed to be substantially the same.

Turning briefly to FIG. 2, illustrated is a graph 200 depicting a relationship, at least in one embodiment, between the delay time and the desired resistivity of the post-etch clean rinsing agent. As is illustrated in the graph 200 of FIG. 2, for any delay time between zero hours and 25 hours, the resistivity may be selected. For instance, for a 5-hour delay time, as depicted by the dotted lines 210, the resistivity of the rinsing agent should be approximately 250 k$\Omega$/cm (e.g., plus or minus about 30 k$\Omega$/cm). Nevertheless, in most instances, based upon the relationship shown in FIG. 2, the resistivity should be between about 120 k$\Omega$/cm and about 13,000 k$\Omega$/cm for any conceivable delay time. Resistivity values outside of this range would tend not to provide superior results, as are attainable using the inventive aspects of the present invention. Moreover, without the recognition of the correlation between the delay time and the resistivity, such resistivities would generally not be used.

It should be noted that the specific relationship of FIG. 2 is but one relationship that might exist. For example, different manufacturing processes might have their own specific relationships. In any event, the general relationship of resistivity as to delay time, as a whole, should remain intact across the different embodiments.

Returning back to FIG. 1, the resistivity of the rinsing agent may be adjusted using a variety of different processes. For instance, in an embodiment wherein the rinsing agent is deionized (DI) water, the resistivity of the DI water may be adjusted by at least one of infusing or degasifying. The infusing may be accomplished by passing DI water having a resistivity that needs adjusting under a polymer membrane pressurized with $CO_2$. In this embodiment, the $CO_2$ diffuses through the polymer membrane into the DI water, thereby adjusting the pH and resistivity of the resulting DI water. The specific resistivity of the resulting DI water may be adjusted based upon the amount of $CO_2$ diffused through the polymer membrane into the DI water.

In the other degasifying embodiment, standard water may be passed under a membrane having a vacuum on the opposing side thereof. In this embodiment, the vacuum causes gases within the standard water, which diffuse through the membrane and out of the water, to be removed from the system and not allowed to diffuse back thru the membrane and back into the standard water, thereby forming DI water having the appropriate resistivity. The resistivity, in this embodiment, may be adjusted based upon the amount of gasses withdrawn from the standard water.

The tool required to adjust the resistivity of the rinsing agent may be included within the post-etch clean tool. Alternatively, the tool required to adjust the resistivity of the rinsing agent may be a stand-alone unit that only supplies the rinsing agent. In either of these embodiments, however, the tool required to adjust the resistivity of the rinsing agent would generally have an interface for variably adjusting the resistivity of the rinsing agent.

The interface, in one embodiment is desirably a readily adjustable interface. The phrase "readily adjustable," as used herein, means that the resistivity of the rinsing agent exiting the tool may be easily adjusted (e.g., may be adjusted within a timeframe that allows the process to be manufacturing worthy from a throughput standpoint). For instance, the tool would not need significant modifications or adjustments to effectuate the change in resistivity. In most instances, the user of the tool would be capable of quickly making the adjustment, and thus no tool technician would be needed. Moreover, the tool would also not need modification to any software associated with the interface, to provide the adjusted resistivity.

In one embodiment, the readily adjustable interface includes an analog or digital mechanism for quickly adjusting the resistivity of the rinsing agent. For example, a dial could be made part of the interface for adjusting the resistivity of the rinsing agent. Alternatively, software and some sort of input device (e.g., a keyboard or push-panel device) could be used to adjust the resistivity of the rinsing agent. In another embodiment, the interface is configured to accept delay time information fed forward from another device, and thereafter automatically make an adjustment to the resistivity of the rinsing agent.

It should be noted at this point in the discussion that the order of step 140, as compared to previous steps, may change while remaining within the purview of the present invention. For example, one embodiment exists wherein a delay time of previously run lots of wafers is used to modify the resistivity of the rinsing agent for the instant lot of wafers. Thus, in this embodiment the modifying of the resistivity of step 150 might occur before even providing the substrate in step 110. The other embodiment, as discussed with respect to FIG. 2, requires that step 150 follow step 140 such that the delay time used to adjust the resistivity is the delay time of the instant lot of wafers. Obviously, the ability of the tool for adjusting the resistivity to accommodate real-time adjustment would be instrumental to this embodiment.

After modifying the resistivity of the rinsing agent, the modified rinsing agent could be exposed to the substrate in a step 160. In many instances, the exposing of the substrate to the modified rinsing agent occurs in the same post-etch clean tool as used to clean the substrate in the aforementioned step 140. As previously indicated, the modified rinsing agent tends to react with remaining elements of the post-etch clean to take on a reactive component. This reactive component is believed to be the feature that allows the modified rinsing agent to remove at least a portion of the remaining undesirable residue.

After completing step 160, the process could stop in step 165. In the embodiment wherein the process stops in the step 165, the substrate might then be removed from the post-etch clean tool and placed within a metal deposition tool, wherein the metal deposition tool would be used to deposit one or more conductors within the one or more openings. Alternatively, the process might return back to step 110, or any previous step, to begin the process again.

The above-described process of the present invention provides many desirable benefits previously not provided by prior art processes. First, the process allows a less aggressive post-etch clean to be used, such that the CD's of the vias and trenches remain intact. However, in doing so, the present invention still provides the appropriate removal of the residue from the vias and trenches. Accordingly, the yield loss issue that typically exists when using less aggressive post-etch cleans is improved, if not corrected.

Moreover, the process allows for tailoring the resistivity of the rinsing agent based upon the delay time, or in another embodiment, a desired delay time. Take for instance, a company that believes the desired delay time needed to accommodate the desired control, as well as throughput, is 7 hours. The present process would allow that company to select the resistivity of their rinsing agent based upon the desired 7-hour delay time. The process is equally important to the company whom already has a mandatory delay time, wherein the resistivity is tailored to the mandatory delay time.

The process, and more specifically the tool for adjusting the resistivity of the rinsing agent, may further allow for the readily adjusting of the resistivity. As previously mentioned, the tool user, as opposed to the tool technician or a software programmer, may configure the tool so as to allow the adjusting of the rinsing agent. Accordingly, the process and/or tool allows for the feeding forward, as well as real time adjustment to the resistivity of the rinsing agent.

Those skilled in the art to which the invention relates will appreciate that other and further additions, deletions, substitutions and modifications may be made to the described embodiments without departing from the scope of the invention.

What is claimed is:

1. A method for manufacturing an integrated circuit, comprising:
    etching one or more openings within a substrate using an etch tool;
    subjecting the one or more openings to a post-etch clean, wherein a delay time exists between removing the substrate from the etch tool and the subjecting the one or more openings to the post-etch clean;
    adjusting a resistivity of a deionized water rinsing agent by varying the amount of $CO_2$ in the deionized water rinsing agent based on the delay time to maximize a removal of remaining residue; and
    exposing the substrate having been subjected to the post-etch clean to the deionized water rinsing agent.

2. The method of claim 1, wherein the amount of $CO_2$ is reduced for longer delay time and increased for shorter delay time.

3. The method of claim 2, wherein the resistivity of the deionized water rinsing agent ranges from about 120 kΩ/cm to about 13,000 kΩ/cm.

4. The method of claim 1, wherein the amount of $CO_2$ in the deionized water rinsing agent is adjusted to have a selected pH and resistivity that provides a reactive component to further clean the one or more openings.

5. The method of claim 1, wherein the amount of $CO_2$ in the deionized water rinsing agent is varied by passing gas through a membrane through which the deionized water rinsing agent is passed.

6. The method of claim 1, wherein the post-etch clean comprises a fluoride-containing semi-aqueous solvent.

7. A method for manufacturing an integrated circuit, comprising:
    etching one or more openings within a dielectric layer of a substrate;
    subjecting the one or more openings to a post-etch clean including cleaning with a chemical solvent followed by rinsing with deionized water; and
    adjusting the pH and resistivity of the deionized water based on a delay time between the etching and the post-etch clean by varying an amount of $CO_2$ in the deionized water.

8. The method of claim 7, wherein the one or more openings comprise one or more via and/or trench openings.

9. The method of claim 7, wherein the amount of $CO_2$ is reduced for longer delay time and increased for shorter delay time.

10. The method of claim 9, wherein the amount of $CO_2$ is varied by diffusing gas through a membrane through which the deionized water is passed.

11. The method of claim 7, wherein the delay time between etching and post-etch clean in the manufacture of an integrated circuit manufactured in first wafer lot is used to vary the amount of $CO_2$ in deionized water used for rinsing in the manufacture of an integrated circuit manufactured in a second wafer lot.

12. The method of claim 7, wherein the etching is performed in an etch tool and the post-etch clean is performed in a post-etch clean tool, different from the etch tool.

13. The method of claim 12, wherein the pH and resistivity of the deionized water is adjusted based on delay time between removing the substrate from the etch tool and beginning the post-etch clean in the post-etch tool.

14. The method of claim 7, wherein the chemical solvent is a fluoride-containing solvent.

* * * * *